United States Patent
Kitada et al.

(10) Patent No.: US 10,199,559 B2
(45) Date of Patent: Feb. 5, 2019

(54) PIEZOELECTRIC ELEMENT AND PIEZOELECTRIC ELEMENT APPLIED DEVICE

(71) Applicant: Seiko Epson Corporation, Tokyo (JP)

(72) Inventors: Kazuya Kitada, Suwa (JP); Masayuki Omoto, Chino (JP)

(73) Assignee: Seiko Epson Corporation (JP)

( * ) Notice: Subject to any disclaimer, the term of this patent is extended or adjusted under 35 U.S.C. 154(b) by 342 days.

(21) Appl. No.: 15/137,240

(22) Filed: Apr. 25, 2016

(65) Prior Publication Data

US 2017/0345994 A1 Nov. 30, 2017

(30) Foreign Application Priority Data

May 28, 2015 (JP) ................. 2015-109078

(51) Int. Cl.
*H01L 41/18* (2006.01)
*B41J 2/14* (2006.01)
*H01L 41/08* (2006.01)
*H01L 41/09* (2006.01)
(Continued)

(52) U.S. Cl.
CPC .......... *H01L 41/18* (2013.01); *B41J 2/14233* (2013.01); *H01L 41/047* (2013.01);
(Continued)

(58) Field of Classification Search
CPC ... H01L 41/18; H01L 41/047; H01L 41/0973; B41J 2/14274; B41J 2002/14258
See application file for complete search history.

(56) References Cited

U.S. PATENT DOCUMENTS 8,022,604 B2 9/2011 Ozawa et al.
8,674,589 B2 3/2014 Hatano et al.
(Continued)

FOREIGN PATENT DOCUMENTS

JP S56-12080 A 9/1981
JP 2009-114049 A 5/2009
(Continued)

OTHER PUBLICATIONS

Lingyan Wang et al., "Structures and Electrical Properties of Mn- and Co-Doped Lead-Free Ferroelectric $K_{0.5}Na_{0.5}NbO_3$ Films Prepared by a Chemical Solution Deposition Method", Thin Solid Films, vol. 537, pp. 65-79, 2013.
(Continued)

*Primary Examiner* — J. San Martin
(74) *Attorney, Agent, or Firm* — Harness, Dickey & Pierce, P.L.C.

(57) ABSTRACT

There is provided a piezoelectric element which includes a first electrode which is formed on a substrate, a piezoelectric layer which is formed on the first electrode, and is formed from a compound oxide having an $ABO_3$ type perovskite structure in which potassium (K), sodium (Na), niobium (Nb), and manganese (Mn) are provided, and a second electrode which is formed on the piezoelectric layer. The manganese includes bivalent manganese ($Mn^{2+}$), trivalent manganese ($Mn^{3+}$), and tetravalent manganese ($Mn^{4+}$). A molar ratio ($Mn^{2+}/Mn^{3+}+Mn^{4+}$) of the bivalent manganese to a sum of the trivalent manganese and the tetravalent manganese is equal to or greater than 0.31.

12 Claims, 11 Drawing Sheets

(51) Int. Cl.
    *H01L 41/187*     (2006.01)
    *H01L 41/047*     (2006.01)
    *H01L 41/317*     (2013.01)
    *H01L 41/318*     (2013.01)

(52) U.S. Cl.
    CPC ...... *H01L 41/0805* (2013.01); *H01L 41/0973* (2013.01); *H01L 41/1873* (2013.01); *H01L 41/317* (2013.01); *B41J 2002/14241* (2013.01); *B41J 2202/03* (2013.01); *H01L 41/318* (2013.01)

(56) References Cited

U.S. PATENT DOCUMENTS

| | | |
|---|---|---|
| 9,893,269 B2 | 2/2018 | Ifuku et al. |
| 2009/0102325 A1 | 4/2009 | Ozawa et al. |
| 2014/0084754 A1 | 3/2014 | Maejima et al. |
| 2015/0155556 A1* | 6/2015 | Kawakami ......... C01G 45/1228 252/182.1 |
| 2015/0349666 A1 | 12/2015 | Ifuku et al. |
| 2016/0172574 A1 | 6/2016 | Ikeuchi et al. |

FOREIGN PATENT DOCUMENTS

| | | |
|---|---|---|
| JP | 2013-014470 A | 1/2013 |
| JP | 2014-060267 A | 4/2014 |
| JP | 2014-128114 A | 7/2014 |
| WO | WO-2015-033791 A1 | 3/2015 |

OTHER PUBLICATIONS

Extended European Search Report for Application No. EP 16 17 1516 dated Nov. 3, 2016 (5 pages).

S. Wongsaenmai et al., "Crystal Structure and Ferroelectric Properties of Mn-Doped (($Ka_{0.5}Na_{0.5}$)$_{0.935}Li_{0.065}$) $NbO_3$ Lead-Free Ceramics", Current Applied Physics, North-Holland, Amsterdam, NL, vol. 12, No. 2, Jul. 19, 2011, pp. 418-421.

Matsuda et al., "Electrical Properties of Lead-Free Ferroelectric Mn-Doped $K_{0.5}Na_{0.5}NbO_3$—$CaZrO_3$ Thin Films Prepared by Chemical solution Deposition", Japanese Journal of Applied Physics 51 (2012) 09LA03 (6 pages).

\* cited by examiner

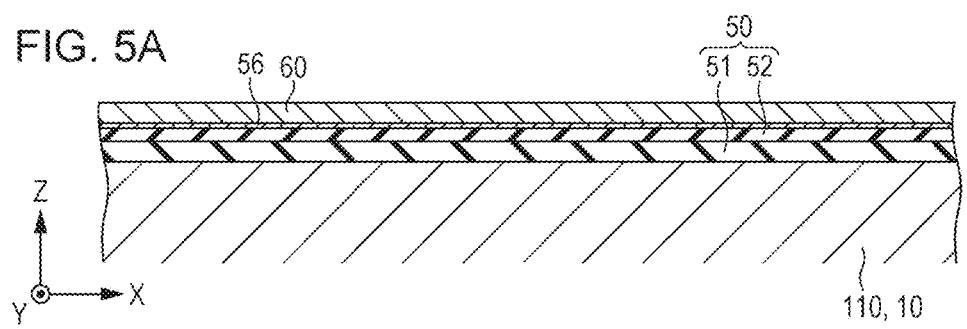
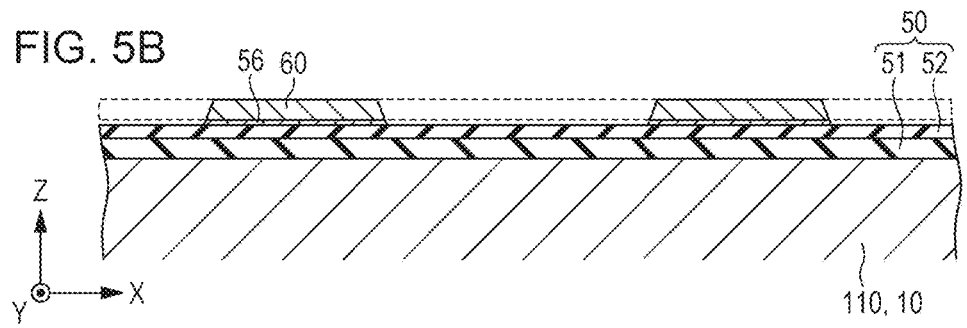
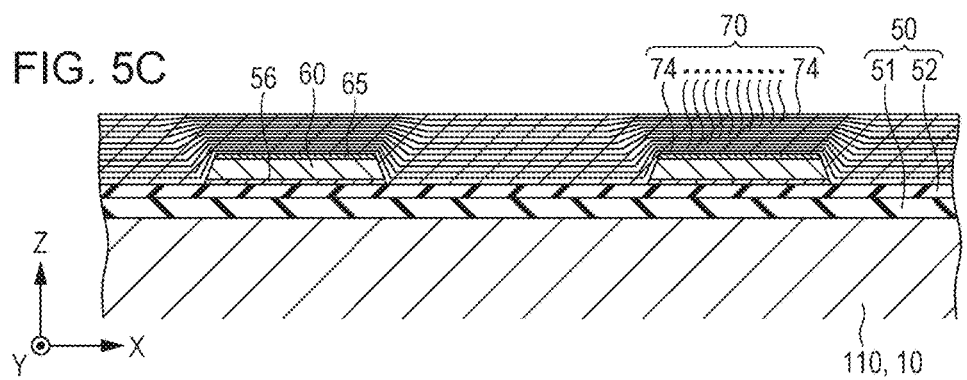
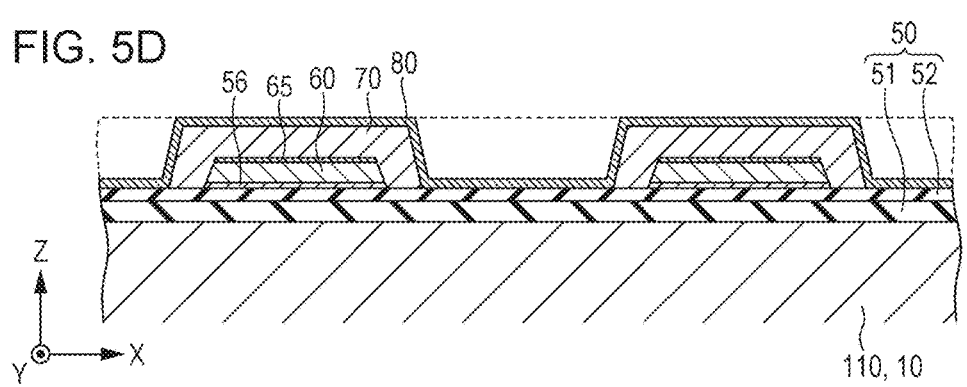

US 10,199,559 B2

PIEZOELECTRIC ELEMENT AND PIEZOELECTRIC ELEMENT APPLIED DEVICE

BACKGROUND

1. Technical Field

The present invention relates to a piezoelectric element and a piezoelectric element applied device.

2. Related Art

Generally, a piezoelectric element includes a piezoelectric layer and two electrodes. The piezoelectric layer has electromechanical conversion characteristics. The piezoelectric layer is interposed between the two electrodes. A device (piezoelectric element applied device) which uses such a piezoelectric element as a driving source has been recently actively developed. As the piezoelectric element applied device, for example, a liquid ejecting head represented by an ink jet recording head, a MEMS element represented by a piezoelectric MEMS element, an ultrasonic measurement device represented by an ultrasonic sensor and the like, and a piezoelectric actuator device are provided.

For example, as a material (piezoelectric material) of a piezoelectric layer of a piezoelectric element used in the liquid ejecting head, potassium sodium niobate (KNN; (K, Na)NbO$_3$) has been proposed (for example, see JP-A-2014-60267 (Claim 1, paragraph [0029] and the like) and JP-A-2014-65317 (Claim 1, paragraph [0019] and the like)). In JP-A-2014-60267, a piezoelectric element is configured in such a manner that a lower adhesive layer formed of Ti, a lower electrode, a KNN piezoelectric layer, an upper electrode, and the like are layered on a substrate. In JP-A-2014-65317, a piezoelectric element is configured in such a manner that an elastic film, an adhesive layer formed of Ti and the like, a first electrode, a KNN piezoelectric layer, a second electrode, and the like are layered on a substrate.

Here, as a major problem of potassium sodium niobate, poor leakage characteristics are exemplified. Thus, improving the leakage characteristics by adding an additive such as Mn to potassium sodium niobate has been proposed (see Matsuda et al. Japanese Journal of Applied Physics 51 (2012) 09LA03).

However, a state of potassium sodium niobate or a state of the additive causes crystallinity, crystal orientation, and piezoelectric characteristics to be largely changed in addition to the leakage characteristics. Thus, the optimal state is completely unknown. Such a problem is not limited to the piezoelectric element used in the liquid ejecting head, and also occurs similarly in a piezoelectric element which is used in other piezoelectric element applied devices.

SUMMARY

An advantage of some aspects of the invention is at least one of improving the crystal orientation of a piezoelectric layer, and improving various types of characteristics in a piezoelectric element using a potassium sodium niobate-based piezoelectric material, and a piezoelectric element applied device.

According to an aspect of the invention, there is provided a piezoelectric element which includes a first electrode which is formed on a substrate, a piezoelectric layer which is formed on the first electrode, and is formed from a compound oxide having an ABO$_3$ type perovskite structure in which potassium (K), sodium (Na), niobium (Nb), and manganese (Mn) are provided, and a second electrode which is formed on the piezoelectric layer. The manganese includes bivalent manganese (Mn$^{2+}$), trivalent manganese (Mn$^{3+}$), and tetravalent manganese (Mn$^{4+}$). A molar ratio (Mn$^{2+}$/Mn$^{3+}$+Mn$^{4+}$) of the bivalent manganese to a sum of the trivalent manganese and the tetravalent manganese is equal to or greater than 0.31.

According to the aspect, since the bivalent manganese is contained so as to cause the molar ratio (Mn$^{2+}$/Mn$^{3+}$+Mn$^{4+}$) of the bivalent manganese to be equal to or greater than 0.31, the crystal orientation of the piezoelectric layer is improved. It is possible to easily obtain an engineered domain structure, and to improve piezoelectric characteristics by improving the crystal orientation of the piezoelectric layer.

Here, the molar ratio (Mn$^{2+}$/Mn$^{3+}$+Mn$^{4+}$) of the bivalent manganese to the sum of the trivalent manganese and the tetravalent manganese is preferably equal to or smaller than 3.90.

It is possible to obtain a piezoelectric element having good leakage characteristics, by causing the molar ratio of the bivalent manganese to be equal to or smaller than 3.90.

According to another aspect of the invention, there is provided a piezoelectric element which includes a first electrode which is formed on a substrate, a piezoelectric layer which is formed on the first electrode, and is formed from a compound oxide having an ABO$_3$ type perovskite structure in which potassium (K), sodium (Na), niobium (Nb), and manganese (Mn) are provided, and a second electrode which is formed on the piezoelectric layer. The manganese includes bivalent manganese (Mn$^{2+}$), trivalent manganese (Mn$^{3+}$), and tetravalent manganese (Mn$^{4+}$). A molar ratio (Mn$^{2+}$/Mn$^{3+}$+Mn$^{4+}$) of the bivalent manganese to the sum of the trivalent manganese and the tetravalent manganese is equal to or smaller than 3.90.

According to the aspect, since the bivalent manganese is contained so as to cause the molar ratio (Mn$^{2+}$/Mn$^{3+}$+Mn$^{4+}$) of the bivalent manganese to be equal to or smaller than 3.90, it is possible to obtain a piezoelectric element having good leakage characteristics. In addition, it is possible to easily obtain an engineered domain structure, and to improve piezoelectric characteristics by improving the crystal orientation of the piezoelectric layer.

The content of the manganese is preferably greater than 0.3 mol %, with respect to the total amount of metallic elements constituting a B site of the ABO$_3$ type perovskite structure.

According to the aspect, it is possible to cause the molar ratio (Mn$^{2+}$/Mn$^{3+}$+Mn$^{4+}$) of the bivalent manganese to be greater than a predetermined value, and the crystal orientation of the compound oxide is further improved.

The content of the manganese is preferably equal to or smaller than 2 mol %, with respect to the total amount of metallic elements constituting a B site of the ABO$_3$ type perovskite structure.

According to the aspect, it is possible to cause the molar ratio (Mn$^{2+}$/Mn$^{3+}$+Mn$^{4+}$) of the bivalent manganese to be smaller than a predetermined value, and to obtain a piezoelectric element having good leakage characteristics.

The compound oxide in the ABO$_3$ type perovskite structure preferably has a composite represented by the following formula (1).

$$(K_x, Na_{1-x})(Nb_{1-y}, Mn_y)O_3 \tag{1}$$

$(0.1 \le x \le 0.9)$

The compound oxide represented by the above formula (1) is a so-called KNN-based compound oxide. According to the embodiment, in a case where a piezoelectric material formed from such KNN-based compound oxide is used, it is possible to improve the crystal orientation of a piezoelectric layer. In addition, it is possible to improve various types of characteristics.

According to still another aspect of the invention, there is provided a piezoelectric element applied device which includes the piezoelectric element described in any one of the above aspects. According to the aspect, since the piezoelectric element is provided, it is possible to provide a device which is functionally excellent.

BRIEF DESCRIPTION OF THE DRAWINGS

The invention will be described with reference to the accompanying drawings, wherein like numbers reference like elements.

FIGS. 5A to 5D are diagrams illustrating a manufacturing example of the recording head according to the embodiment.

DESCRIPTION OF EXEMPLARY EMBODIMENTS

Figure 1:
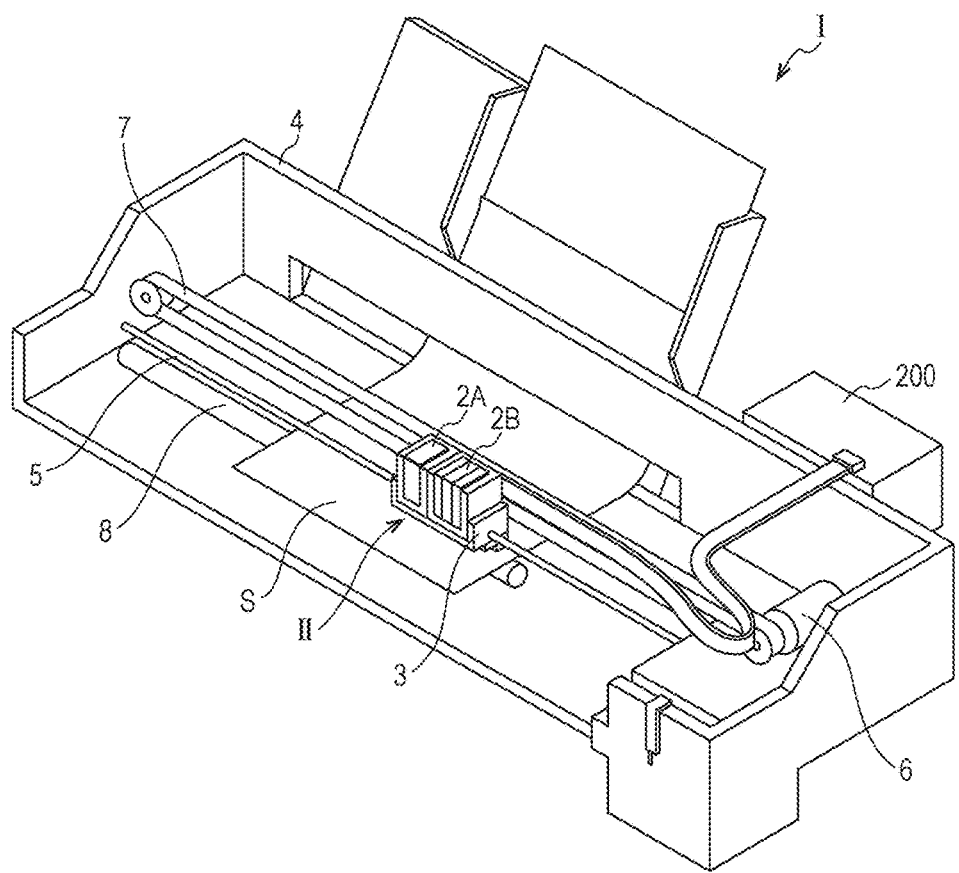
FIG. 1 is a diagram illustrating a schematic configuration of a recording apparatus according to an embodiment.

Hereinafter, an embodiment according to the invention will be described with reference to the drawings. The following descriptions are used for describing an aspect of the invention, and may be arbitrarily changed in a range of the invention. In the drawings, components denoted by the same reference numerals indicate the same member as each other, and descriptions thereof will be appropriately omitted. In FIGS. 2 to 6C, X, Y, and Z indicate three spatial axes perpendicular to each other. In the specification, descriptions will be made by using directions along the three spatial axes, which are respectively set as an X direction, a Y direction, and a Z direction. The Z direction indicates a thickness direction or a layered direction of a plate, a layer, and a film. The X direction and the Y direction indicate an in-plane direction of the plate, the layer, and the film.

Embodiment 1

FIG. 1 is an example of a liquid ejecting apparatus according to the embodiment of the invention. FIG. 1 illustrates a schematic configuration of an ink jet type recording apparatus (recording apparatus).

In an ink jet type recording apparatus I, an ink jet recording head unit (head unit II) is provided so as to be attachable to cartridges 2A and 2B. The cartridges 2A and 2B constitute an ink supply section. The head unit II includes a plurality of ink jet recording heads (recording heads) and is mounted in a carriage 3. The carriage 3 is provided with a carriage shaft 5 so as to be movable in a shaft direction. The carriage shaft 5 is attached to a main body 4 of the apparatus. The head unit II and the carriage 3 are configured so as to respectively enable discharging of a black ink composition and a color ink composition, for example.

A driving force of a driving motor 6 is transferred to the carriage 3 through a plurality of gears and timing belts 7 (not illustrated). Thus, the carriage 3 is moved along the carriage shaft 5. A transporting roller 8 is provided as a transporting section in the main body 4 of the apparatus. A recording sheet S which is a recording medium such as paper is transported by the transporting roller 8. The transporting section is not limited to the transporting roller, and may be a belt, a drum, or the like.

A piezoelectric element is used as an actuator in the ink jet recording head. It is possible to avoid deterioration of various types of characteristics (durability, ink ejecting characteristics, and the like) of the ink jet type recording apparatus I by using the piezoelectric element (which will be described later).

Figure 2:
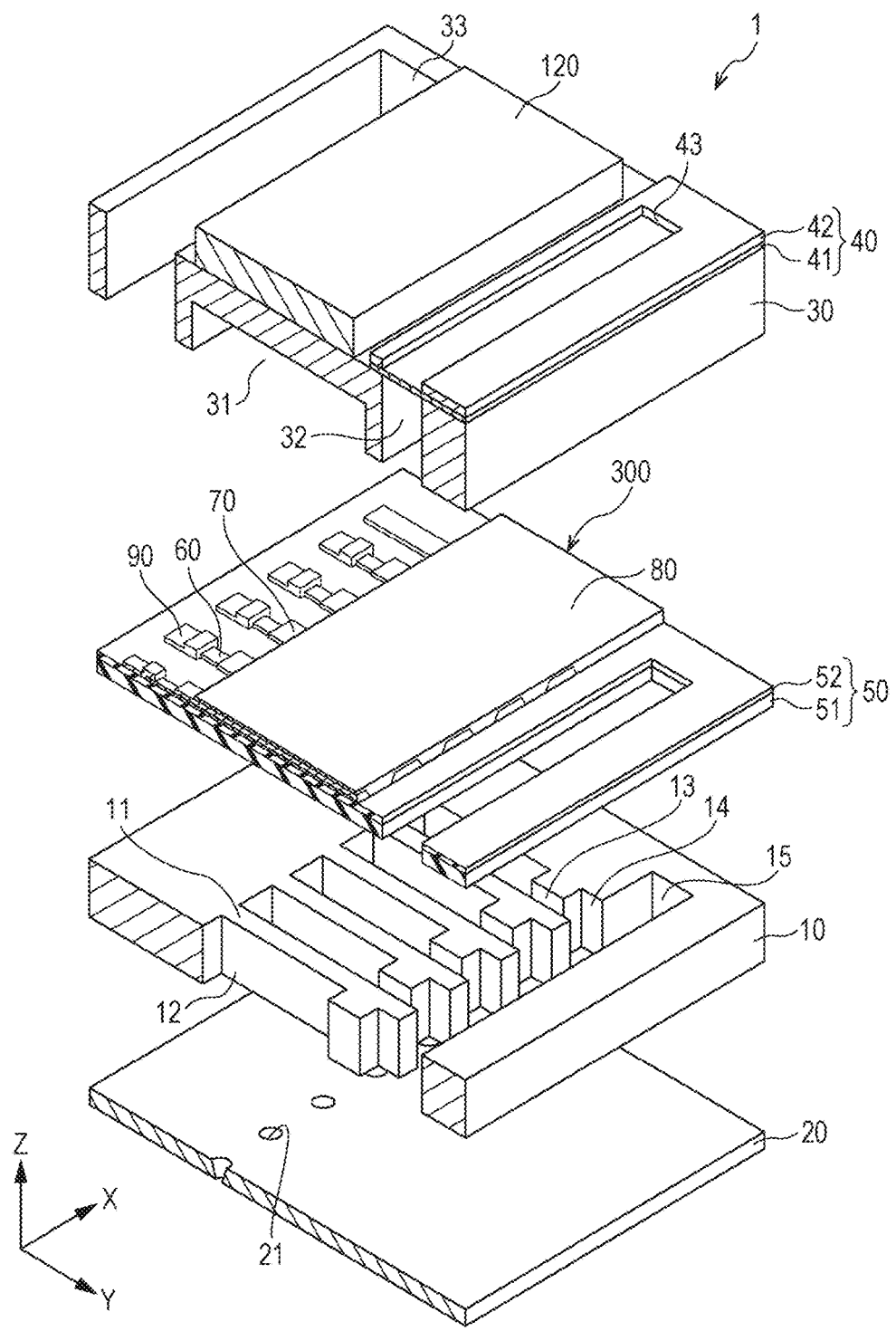
FIG. 2 is an exploded perspective view illustrating a schematic configuration of a recording head according to the embodiment.
Figure 3A:
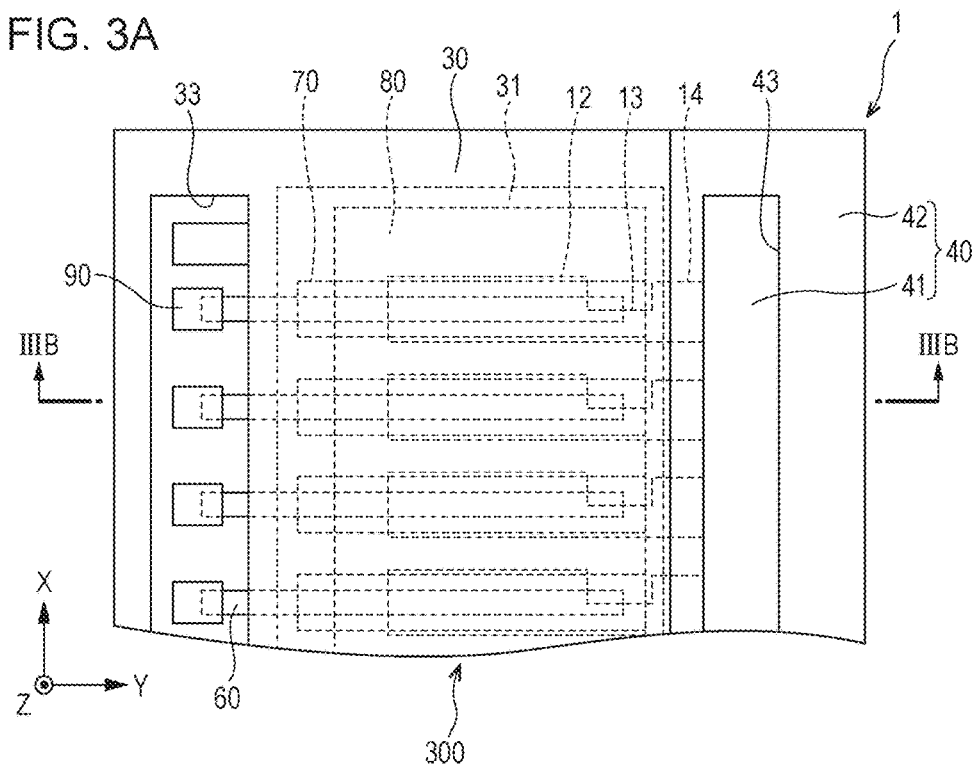
FIGS. 3A and 3B are a plan view and a cross-sectional view illustrating a schematic configuration of the recording head according to the embodiment.
Figure 3B:
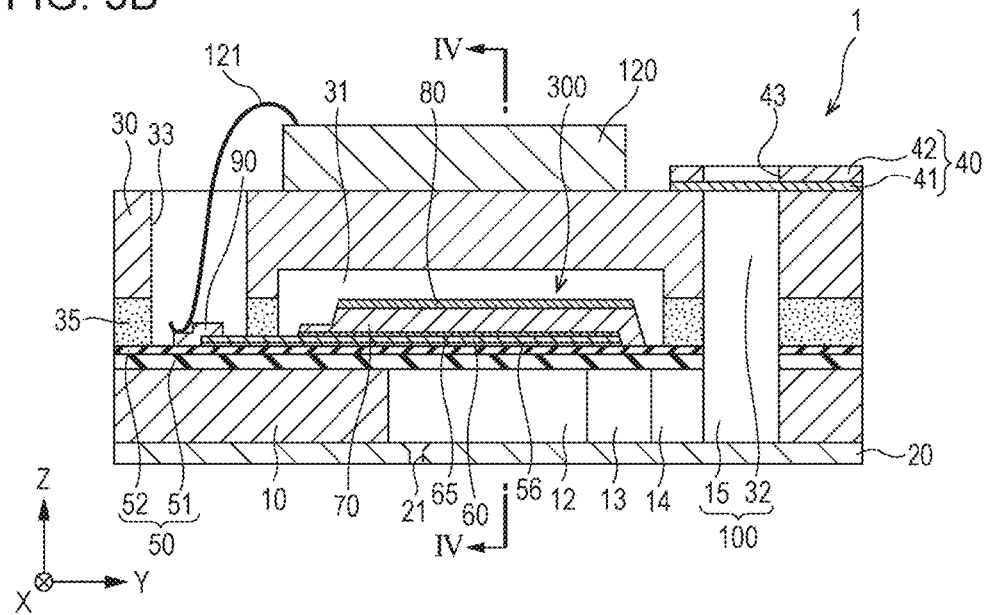

Next, the ink jet recording head which is an example of a liquid ejecting head will be described. FIG. 2 is an exploded perspective view illustrating a schematic configuration of the ink jet recording head. FIG. 3A is a plan view illustrating the schematic configuration of the ink jet recording head (plan view obtained by viewing a passage formation substrate from a piezoelectric element side). FIG. 3B is a cross-sectional view taken along line IIIB-IIIB in FIG. 3A.

A plurality of partition walls 11 are formed in the passage formation substrate 10 (below referred to as "substrate 10"). The passage formation substrate 10 is subdivided into a plurality of pressure generation chambers 12 by the partition walls 11. That is, the pressure generation chambers 12 are arranged in the substrate 10 in the X direction (direction in which nozzle openings 21 for discharging an ink of the same color) are arranged. As such a substrate 10, for example, a silicon single crystal substrate may be used.

In the substrate 10, an ink supply path 13 and a communication path 14 are formed on one end portion side of the pressure generation chamber 12 in the Y direction. The ink supply path 13 is configured in such a manner that one side of the pressure generation chamber 12 is narrowed from the X direction, and thus an opening area of the pressure generation chamber 12 becomes small. The communication path 14 has substantially the same width as the pressure generation chamber 12 in the X direction. A communication portion 15 is formed on the outside (+Y direction side) of the communication path 14. The communication portion 15 constitutes a portion of a manifold 100. The manifold 100 functions as a common ink chamber for the pressure generation chambers 12. In this manner, a fluid passage which is formed from the pressure generation chamber 12, the ink supply path 13, the communication path 14, and the communication portion 15 is formed in the substrate 10.

For example, a SUS nozzle plate 20 is bonded to one surface side (surface on a −Z direction side) of the substrate 10. The nozzle openings 21 are arranged in the nozzle plate 20 in the X direction. The nozzle openings 21 respectively communicate with the pressure generation chambers 12. The nozzle plate 20 may be bonded to the substrate 10 by using an adhesive, a heat-welding film, or the like.

A vibration plate 50 is formed on another surface (surface on a +Z direction) of the substrate 10. The vibration plate 50 includes, for example, an elastic film 51 formed on the substrate 10, and a zirconium oxide layer 52 formed on the elastic film 51. The elastic film 51 is formed from silicon dioxide ($SiO_2$), for example. The zirconium oxide layer 52 is formed from zirconium dioxide ($ZrO_2$), for example. The elastic film 51 may not be a member separate from the substrate 10. A portion of the substrate 10 is processed so as to be thin, and a part obtained by the processing may be used as the elastic film.

A piezoelectric element 300 is formed on the zirconium oxide layer 52 with an adhesive layer 56 interposed between the piezoelectric element 300 and the zirconium oxide layer 52. The piezoelectric element 300 includes a first electrode 60, a piezoelectric layer 70, and a second electrode 80. The adhesive layer 56 is formed from, for example, a titanium oxide ($TiO_X$) layer, a titanium (Ti) layer, a silicon nitride (SiN) layer, or the like. The adhesive layer 56 has a function of improving adhesiveness between the piezoelectric layer 70 and the vibration plate 50. The adhesive layer 56 may be omitted.

In the embodiment, displacement of the piezoelectric layer 70 having electromechanical conversion characteristics causes displacement to occur in the vibration plate 50 and the first electrode 60. That is, in the embodiment, the vibration plate 50 and the first electrode 60 substantially have a function as a vibration plate. The elastic film 51 and the zirconium oxide layer 52 may be omitted and only the first electrode 60 may function as the vibration plate. In a case where the first electrode 60 is directly provided on the substrate 10, the first electrode 60 is preferably protected by using an insulating protective film and the like, so as not to bring an ink into contact with the first electrode 60.

The first electrode 60 is divided for each of the pressure generation chambers 12. That is, the first electrode 60 is configured as an individual electrode which is independent for each of the pressure generation chambers 12. The first electrode 60 is formed so as to have a width narrower than the width of each of the pressure generation chambers 12 in the X direction. The first electrode 60 is formed so as to have a width wider than the width of each of the pressure generation chambers 12 in the Y direction. That is, both end portions of the first electrode 60 are formed to the outside of an area facing the pressure generation chamber 12 in the Y direction. A lead electrode 90 is connected to one end portion side (opposite side of the communication path 14) of the first electrode 60 in the Y direction.

The piezoelectric layer 70 is provided between the first electrode 60 and the second electrode 80. The piezoelectric layer 70 is formed so as to have a width wider than the width of the first electrode in the X direction. The piezoelectric layer 70 is formed so as to have a width wider than the length of the pressure generation chamber 12 in the Y direction. An end portion (end portion on the +Y direction) of the ink supply path 13 side of the piezoelectric layer 70 in the Y direction is formed on the outside of an end portion of the first electrode 60. That is, another end portion (end portion on the +Y direction) of the first electrode 60 is covered with the piezoelectric layer 70. One end portion (end portion on a −Y direction side) of the piezoelectric layer 70 is provided on the inner side of one end portion (end portion on the −Y direction side) of the first electrode 60. That is, the one end portion (end portion on the −Y direction side) of the first electrode 60 is not covered with the piezoelectric layer 70.

The second electrode 80 is provided over the piezoelectric layer 70, the first electrode 60, and the vibration plate 50 in the X direction. That is, the second electrode 80 is configured as a common electrode which is commonly used for a plurality of piezoelectric layers 70. Instead of the second electrode 80, the first electrode 60 may be used as the common electrode.

A protective substrate 30 is bonded to the substrate 10 in which the piezoelectric element 300 is formed, by using an adhesive 35. The protective substrate 30 includes a manifold portion 32. At least a portion of the manifold 100 is configured by the manifold portion 32. The manifold portion 32 according to the embodiment is formed in a width direction (X direction) of the pressure generation chamber 12, so as to pass through the protective substrate 30 in a thickness direction (Z direction). As described above, the manifold portion 32 communicates with the communication portion 15 of the substrate 10. With the configuration, the manifold 100 which functions as the common ink chamber for the pressure generation chambers 12 is configured.

A piezoelectric element holding portion 31 is formed in an area including the piezoelectric element 300 in the protective substrate 30. The piezoelectric element holding portion 31 has a space which is large enough not to impede the movement of the piezoelectric element 300. The space may be sealed or may not be sealed. A through-hole 33 which passes through the protective substrate 30 in the thickness direction (Z direction) is provided in the protective substrate 30. An end portion of the lead electrode 90 is exposed in the through-hole 33.

A driving circuit 120 which functions as a signal processing unit is fixed to the protective substrate 30. The driving circuit 120 may use, for example, a circuit board or a semiconductor integrated circuit (IC). The driving circuit 120 and the lead electrode 90 are electrically connected to each other through a connection wire 121. The driving circuit 120 may be electrically connected to a printer controller 200.

A compliance substrate 40 which is formed from a sealing film 41 and a fixation plate 42 is bonded to the protective substrate 30. An area of the fixation plate 42, which faces the manifold 100 functions as an opening portion 43 obtained by completely removing the fixation plate 42 in the thickness direction (Z direction). One surface (surface on the −Z direction) of the manifold 100 is sealed by the sealing film 41 having flexibility.

Figure 4:
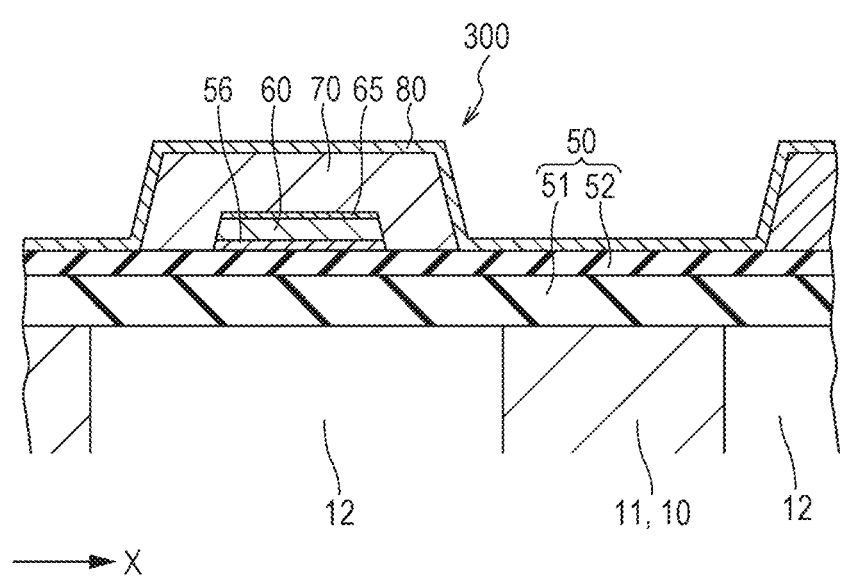
FIG. 4 is an enlarged sectional view illustrating the schematic configuration of the recording head according to the embodiment.

Next, details of the piezoelectric element 300 will be described using FIG. 4. FIG. 4 is a cross-sectional view in the vicinity of the piezoelectric element when FIG. 3B is taken along line IV-IV.

The piezoelectric element 300 includes the zirconium oxide layer 52, the adhesive layer 56, the first electrode 60, a seed layer 65, the piezoelectric layer 70, and the second electrode 80. The thickness of the zirconium oxide layer 52 is about 20 nm. The thickness of the adhesive layer 56 is about 10 nm. The thickness of the first electrode is about 0.1 μm. The thickness of the seed layer 65 is equal to or smaller than 80 nm, and preferably from 10 nm to 50 nm. The piezoelectric layer 70 is a so-called thin-film piezoelectric body. That is, the piezoelectric layer 70 has a thickness which is equal to or smaller than 3.0 μm, preferably from 0.3 μm to 2.0 μm, and more preferably from 0.5 μm to 1.5 μm. The thickness of the second electrode 80 is about 0.1 μm. The value of the thickness of the constituents exemplified herein is only an example, and may be changed in a range without deviating from the gist of the invention. The adhesive layer 56 may be omitted.

As the material of the first electrode 60 and the second electrode 80, precious metal such as platinum (Pt) and iridium (Ir) is appropriate. The material of the first electrode 60 and the material of the second electrode 80 may be materials having conductivity. The material of the first electrode 60 and the material of the second electrode 80 may be the same as each other, or may be different from each other.

In the embodiment, in manufacturing procedures of the piezoelectric layer 70, K or Na contained in a piezoelectric material may be diffused in the first electrode 60. However, as will be described later, the zirconium oxide layer 52 provided between the first electrode 60 and the substrate 10 conducts a stopper function of K or Na. Thus, it is possible to suppress reaching of alkali metal to the substrate 10.

The piezoelectric layer 70 is configured by using a piezoelectric material which is formed from compound oxide of a perovskite structure. The perovskite structure is indicated by a general formula $ABO_3$. In the embodiment, the compound oxide of the $ABO_3$ type perovskite structure which includes K, Na, and Nb is used as the piezoelectric material. An example of the compound oxide includes KNN-based compound oxide represented by the following formula (2).

$$(K_X, Na_{1-X})(Nb_{1-y}, Mn_y)O_3 \quad (2)$$

Here, $0.1 \leq x \leq 0.9$, preferably, $0.3 \leq x \leq 0.7$, and more preferably, $0.4 \leq x \leq 0.6$, and $0.003 < y \leq 0.02$, and preferably, $0.005 \leq y \leq 0.01$ is satisfied.

In the compound oxide of the perovskite structure indicated by the general formula $ABO_3$, oxygen is provided in an A site so as to be 12-coordinated, and oxygen is provided in a B site so as to be 6-coordinated, thereby an octahedron is formed. In KNN-based compound oxide, K and Na are positioned at the A site and Nb and Mn are positioned at the B site.

The compound oxide represented by the formula (2) is so-called a KNN-based compound oxide. The KNN-based compound oxide is a non-lead-based piezoelectric material which does not contain lead (Pb). Thus, the KNN-based compound oxide has excellent biocompatibility, and has a small environmental load. Because the KNN-based compound oxide has excellent piezoelectric characteristics among non-lead-based piezoelectric materials, the KNN-based compound oxide is advantageous for improving various types of characteristics. In addition, the KNN-based compound oxide has the Curie temperature higher than that of other non-lead-based piezoelectric materials (for example, BNT-BKT-BT; $[(Bi, Na)TiO_3]-[(Bi,K)TiO_3]-[BaTiO_3]$), and occurrence of depolarization due to an increase of a temperature is also difficult. Thus, using at a high temperature is possible.

The manganese is contained in a form including a bivalent manganese ($Mn^{2+}$), a trivalent manganese ($Mn^{3+}$), and a tetravalent manganese ($Mn^{4+}$). The molar ratio ($Mn^{2+}/Mn^{3+}+Mn^{4+}$) of the bivalent manganese to the sum of the trivalent manganese and the tetravalent manganese is preferably equal to or greater than 0.31. If the molar ratio of the bivalent manganese is equal to or greater than 0.31, the crystal orientation of the piezoelectric layer is improved. The molar ratio ($Mn^{2+}/Mn^{3+}+Mn^{4+}$) of the bivalent manganese to the sum of the trivalent manganese and the tetravalent manganese is equal to or smaller than 3.90. If the molar ratio of the bivalent manganese is equal to or smaller than 3.90, it is possible to obtain a piezoelectric element having good leakage characteristics. If the bivalent manganese is out from the above range, the crystal orientation is degraded, or a piezoelectric element having good leakage characteristics is not obtained.

It is considered that the ratio of the bivalent manganese is changed by the content of Mn, for example.

In the formula (2), the content of Mn is greater than 0.3 mol %, and preferably equal to or smaller than 1 mol %, with respect to the total amount of metallic elements constituting the B site. It is possible to cause the molar ratio ($Mn^{2+}/Mn^{3+}+Mn^{4+}$) of the bivalent manganese to be greater than a predetermined value by causing the content of Mn to be greater than 0.3 mol %, and preferably equal to or greater than 0.5 mol %, and the crystal orientation of the piezoelectric layer is improved. The content of Mn is equal to or smaller than 2 mol %, and preferably equal to or smaller than 1 mol %, with respect to the total amount of the metallic elements constituting the B site. It is possible to cause the molar ratio ($Mn^{2+}/Mn^{3+}+Mn^{4+}$) of the bivalent manganese to be greater than a predetermined value by causing the content of Mn to be equal to or smaller than 2 mol %, and preferably equal to or smaller than 1 mol %, and it is possible to obtain a piezoelectric element having good leakage characteristics.

It is considered that the ratio of the bivalent manganese is also changed by other causes, for example, baking conditions during manufacturing, and the like.

The piezoelectric material usable in the embodiment is not limited to the composite represented by the formula (2). For example, another element (additive) may be included in the A site or the B site. Examples of the additive include lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), and copper (Cu).

One or more types of this additive may be included. Generally, the amount of the additive is equal to or smaller than 20%, equal to or smaller than 15%, or equal to or smaller than 10%, with respect to the total amount of an element which functions as the main component. Using the additive causes various types of characteristics to be improved, and thus configurations or functions are easily diversified. In a case where there is compound oxide containing the above-described other elements, it is preferable that the $ABO_3$ type perovskite structure is also provided.

As the piezoelectric material, a material having a composite in which some of elements are absent, a material having a composite in which some of elements are surplus, and a material having a composite in which some of elements are substituted with other elements are also included. A material shifted from a composite of stoichiometry by defect or surplus, or a material in which some of elements are substituted with other elements are included in the piezoelectric material according to the embodiment, as long as the basic characteristics of the piezoelectric layer 70 are not changed.

In the specification, "compound oxide of the $ABO_3$ type perovskite structure containing K, Na, and Nb" is not limited only to the compound oxide of the $ABO_3$ type perovskite structure containing K, Na, and Nb. That is, in the specification, the "compound oxide of the $ABO_3$ type perovskite structure containing K, Na, and Nb" includes a piezoelectric material which is represented as a mixed crystal which contains compound oxide (for example, KNN-based compound oxide which is exemplified above) of the $ABO_3$ type perovskite structure containing K, Na, and Nb, and other compound oxide having the $ABO_3$ type perovskite structure.

In the scope of the invention, other compound oxide is not limited. However, as the other compound oxide, a non-lead-based piezoelectric material which does not contain lead (Pb) is preferable. As the other compound oxide, a non-lead-based piezoelectric material which does not contain lead (Pb) and bismuth (Bi) is more preferable. If the compound oxide is used, the piezoelectric element 300 having excellent biocompatibility, and has a small environmental load is obtained.

The piezoelectric layer 70 formed from the compound oxide as described above is preferentially oriented in (100) plane in the embodiment. For example, the piezoelectric layer 70 formed from the KNN-based compound oxide may be preferentially oriented in (110) plane or (111) plane by a predetermined orientation control layer which is provided if necessary. However, in the embodiment, the piezoelectric layer 70 is preferentially oriented in the (100) plane. The piezoelectric layer 70 which is preferentially oriented in the (100) plane improves various types of characteristics easier than a piezoelectric layer which is randomly oriented or is preferentially oriented in another crystal plane. In the specification, preferential orientation means that a crystal of which the content is equal to or greater than 50%, and preferably equal to or greater than 80% is oriented in a predetermined crystal plane. For example, "being preferentially orientated in (100) plane" includes a case where all crystals in the piezoelectric layer 70 are oriented in the (100) plane, and a case where crystals of the half or more (being equal to or greater than 50%, and preferably equal to or greater than 80%) are oriented in the (100) plane.

Next, an example of a manufacturing method of the piezoelectric element 300 will be described along with a manufacturing method of the ink jet recording head 1.

Firstly, a silicon substrate 110 is prepared. Then, the silicon substrate 110 is thermally oxidized, and thus the elastic film 51 formed from silicon dioxide and the like is formed on the surface of the thermally-oxidized substrate 110. A zirconium film is formed on the elastic film 51 by using a sputtering method. The formed zirconium film is thermally oxidized, and thereby the zirconium oxide layer 52 is formed. Thus, in this manner, the vibration plate 50 formed from the elastic film 51 and the zirconium oxide layer 52 is formed. Then, the adhesive layer 56 formed from titanium oxide is formed on the zirconium oxide layer 52 by using a sputtering method or by thermally oxidizing a titanium film. As illustrated in FIG. 5A, the first electrode 60 is formed on the adhesive layer 56 by using a sputtering method, an evaporation method, or the like.

Then, as illustrated in FIG. 5B, a resist (not illustrated) having a predetermine shape is formed as a mask on the first electrode 60. The adhesive layer 56 and the first electrode 60 are simultaneously patterned. Then, as illustrated in FIG. 5C, after the seed layer 65 is provided on the first electrode 60, a plurality of piezoelectric films 74 are formed so as to be superposed on the adhesive layer 56, the first electrode 60, and the vibration plate 50. The piezoelectric layer 70 is formed by the plurality of piezoelectric films 74. The piezoelectric layer 70 may be formed by using a chemical solution method such as a MOD method and a sol-gel method, for example. In addition, the piezoelectric layer 70 may be formed, for example, by using a laser ablation method, a sputtering method, a pulsed layer deposition method (PLD method), a CVD method, an aerosol deposition method, and the like.

The piezoelectric layer 70 formed by using the chemical solution method is formed by repeating a series of processes a plurality of number of times. The series of processes includes processes from a process (coating process) of performing coating with a precursor solution to a process (baking process) of baking the precursor film. Specific procedures in a case where the piezoelectric layer 70 is formed by using the chemical solution method are as follows, for example. Firstly, a precursor solution containing a predetermined metal complex is prepared. In the precursor solution, a metal complex containing K, Na, Nb, and Mn is dissolved or dispersed in an organic solvent by baking.

Examples of the metal complex containing K include potassium 2-ethylhexanoate, potassium carbonate, and potassium acetate. Examples of the metal complex containing Na include sodium 2-ethylhexanoate, sodium carbonate, and sodium acetate. Examples of the metal complex containing Nb include 2-ethyl hexane acid niobium and pentaethoxyniobium. Examples of the metal complex containing Mn include manganese 2-ethylhexanoate. At this time, two or more types of metal complex may be used together. For example, as the metal complex containing K, potassium 2-ethylhexanoate and potassium acetate may be used together. As a solvent, 2-n-butoxyethanol, n-octane, a solvent mixture of 2-n-butoxyethanol and n-octane, and the like are exemplified. The precursor solution may contain an additive agent for stabilizing dispersion of the metal complex containing K, Na, and Nb. As such an additive agent, 2-ethyl hexane acid and the like are exemplified.

The coating with the precursor solution is performed on a portion of the substrate, at which the vibration plate 50, the adhesive layer 56, and the first electrode 60 are formed, and on a portion of the substrate, at which the vibration plate 50 is formed (coating process). Then, the precursor film is heated to a predetermined temperature, for example, to a temperature of about 130° C. to 250° C., and is dried for a predetermined period (drying process). Then, the dried piezoelectric precursor film is heated to a predetermined temperature, for example, to a temperature of about 300° C. to 450° C., and is held for a predetermined period, and thereby being degreased (degreasing process). Finally, if the degreased precursor film is heated to a higher temperature, for example, to a temperature of 500° C. to 800° C., and is held at this temperature, and thereby being crystallized, a piezoelectric film 74 is completed (baking process).

As a heating device used in the drying process, the degreasing process, and the baking process, for example, a rapid thermal annealing (RTA) device, a hot plate, and the like are exemplified. The RTA device performs heating by irradiation with an infrared lamp. The above processes are repeated a plurality of number of times, and thus the piezoelectric layer 70 formed from a plurality of piezoelectric films 74 is formed. In the series of the processes from the coating process to the baking process, the processes from the coating process to the degreasing process may be repeated a plurality of number of times, and then, the baking process may be performed.

In the embodiment, the piezoelectric material contains alkali metal (K or Na). The alkali metal is easily diffused in the first electrode 60 or the adhesive layer 56, in the baking process. If most of the alkali metal reaches the silicon substrate 110 through the first electrode 60 and the adhesive layer 56, the alkali metal is caused to react with the substrate 10. However, in the embodiment, the zirconium oxide layer 52 conducts the stopper function of K or Na. Thus, it is possible to suppress reaching of the alkali metal to the substrate 10.

After that, the piezoelectric layer 70 formed from a plurality of piezoelectric films 74 is patterned so as to have a shape as illustrated in FIG. 5D. Patterning may be performed by using dry etching such as reactive ion etching and ion milling, or wet etching in which an etching liquid is used. Then, the second electrode 80 is formed on the piezoelectric layer 70. The second electrode 80 may be formed by using a method similarly to the first electrode 60. With the above processes, the piezoelectric element 300 which includes the first electrode 60, the piezoelectric layer 70, and the second electrode 80 is completed. In other words, a portion at which the first electrode 60, the piezoelectric layer 70, and the second electrode 80 overlap each other functions as the piezoelectric element 300.

Figure 6A:
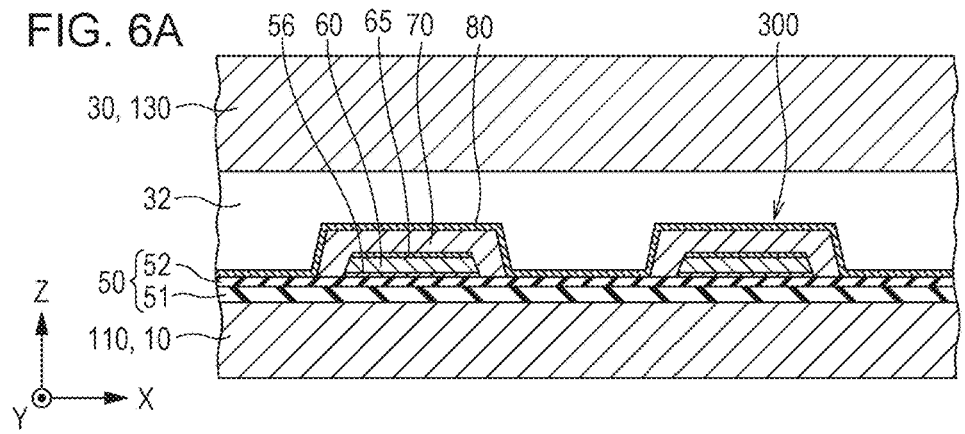
FIGS. 6A to 6C are diagrams illustrating a manufacturing example of the recording head according to the embodiment.
Figure 6B:
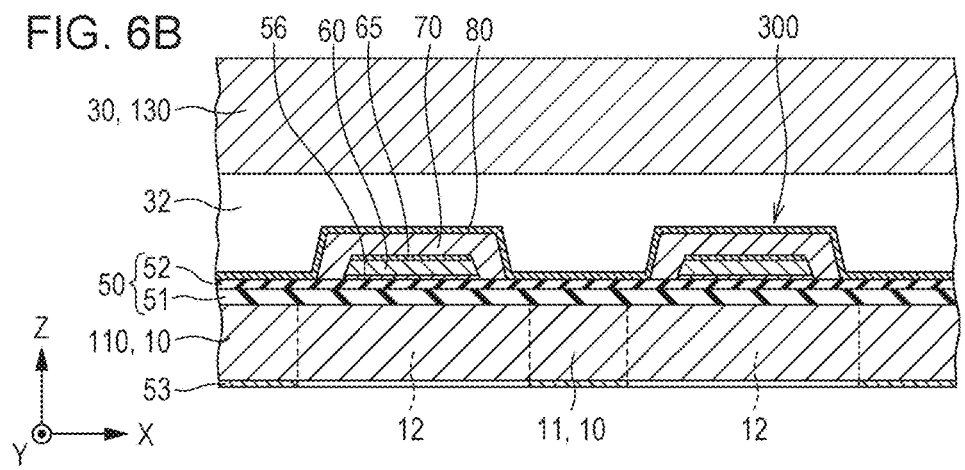
Figure 6C:
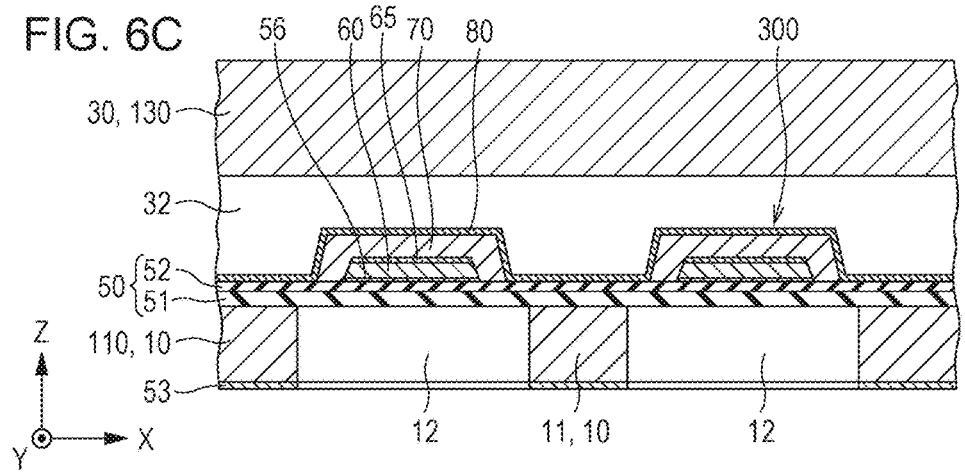

Then, as illustrated in FIG. 6A, a wafer 130 for the protective substrate is bonded to a surface on the piezoelectric element 300 side of the silicon substrate 110, through the adhesive 35 (see FIG. 3B). Then, the surface of the wafer 130 for the protective substrate is abraded so as to become thin. The manifold portion 32 or the through-hole 33 (see FIG. 3B) is formed on the wafer 130 for the protective substrate. Then, as illustrated in FIG. 6B, a mask film 53 is formed on a surface of the silicon substrate 110 on an opposite side of the piezoelectric element 300, and is patterned so as to have a predetermined shape. As illustrated in FIG. 6C, anisotropic etching (wet etching) with an alkaline solution such as KOH is performed on the silicon substrate 110 through the mask film 53. Thus, the ink supply path 13, the communication path 14, and the communication portion 15 (see FIG. 3B) are formed in addition to the pressure generation chamber 12 corresponding to each piezoelectric element 300.

Then, an unnecessary portion of an outer circumferential portion of the silicon substrate 110 and the wafer 130 for the protective substrate is cut out and removed by dicing and the like. The nozzle plate 20 is bonded to the surface of the silicon substrate 110 on the opposite side of the piezoelectric element 300 (see FIG. 3B). The compliance substrate 40 is bonded to the wafer 130 for the protective substrate (see FIG. 3B). With the process until here, an assembly of chips for the ink jet recording head 1 is completed. The assembly is divided for each of the chips, and thus, the ink jet recording head 1 is obtained.

EXAMPLES

Examples of the invention will be described below.

Example 1

A surface of a silicon substrate of 6 inch was thermally oxidized, and thus the elastic film 51 formed from a silicon dioxide film was formed on the substrate. Then, a zirconium film was formed on the elastic film 51 by sputtering, and the zirconium film was thermally oxidized. Thus, the zirconium oxide layer 52 was formed. A titanium film was formed on the zirconium oxide layer 52 by sputtering, and the titanium film was thermally oxidized. Thus, the adhesive layer 56 was formed. Platinum was formed on the adhesive layer by sputtering, and was patterned so as to have a predetermined shape. Thus, the first electrode 60 was formed.

Then, the piezoelectric layer 70 was formed through the following procedures. Firstly, n-octane solutions of potassium 2-ethylhexanoate, sodium 2-ethylhexanoate, 2-ethylhexanoate niobium, and manganese 2-ethylhexanoate were mixed, and thereby a precursor solution was prepared so as to have a composite of the following formula (4).

$(K_{0.4}Na_{0.6})(Nb_{0.98}Mn_{0.02})O_3$ (4)

Then, coating with the prepared precursor solution was performed on the substrate on which the first electrode 60 had been formed, by using a spin coating method (coating process). Then, the substrate was mounted on a hot plate, and was dried at 180° C. for two minutes (drying process). Then, the substrate on the hot plate was degreased at 350° C. for two minutes (degreasing process). Baking was performed at 700° C. for three minutes by a rapid thermal annealing (RTA) device (baking process). The processes from the coating process to the baking process were repeated seven times, and thus the piezoelectric layer 70 formed from seven piezoelectric films 74 was formed.

Platinum was sputtered on the piezoelectric layer 70, and thereby the second electrode 80 was manufactured. With the above procedures, a piezoelectric element of Example 1 was formed.

Example 2

A piezoelectric element of Example 2 was manufactured similar to Example 1 except that the composite of the piezoelectric layer 70 was set as $(K_{0.4}Na_{0.6})(Nb_{0.995}Mn_{0.005})O_3$.

Example 3

A piezoelectric element of Example 3 was manufactured similar to Example 1 except that the composite of the piezoelectric layer 70 was set as $(K_{0.424}Na_{0.636})(Nb_{0.995}Mn_{0.005})O_3$. In this composite, the total amount of the elements in the A site is 1.06 mol, and the total amount of the elements in the B site is 1.00 mol. That is, this composite is a composite in which alkali metal in the A site is excessively added to the composite of the stoichiometry.

Example 4

The composite of the piezoelectric layer 70 was set as $(K_{0.4}Na_{0.6})(Nb_{0.995}Mn_{0.005})O_3$, and the processes from the coating process to the degreasing process were performed similar to Example 1. The baking process was performed at 500° C. for three minutes. The processes from the coating process to the baking process were performed five times, and then thermal treatment was performed at 700° C. for five minutes, and thereby a piezoelectric element of Example 4 was manufactured.

Example 5

A piezoelectric element of Example 5 was manufactured similar to Example 4 except that the composite of the piezoelectric layer 70 was set as $(K_{0.4}Na_{0.6})(Nb_{0.99}Mn_{0.01})O_3$.

Example 6

A piezoelectric element of Example 6 was manufactured similar to Example 4 except that the composite of the piezoelectric layer 70 was set as $(K_{0.4}Na_{0.6})(Nb_{0.987}Mn_{0.013})O_3$.

Example 7

A piezoelectric element of Example 7 was manufactured similar to Example 4 except that the composite of the piezoelectric layer 70 was set as $(K_{0.4}Na_{0.6})(Nb_{0.985}Mn_{0.015})O_3$.

Comparative Example 1

A piezoelectric element of Comparative Example 1 was manufactured similar to Example 1 except that the composite of the piezoelectric layer 70 was set as $(K_{0.4}Na_{0.6})NbO_3$.

Comparative Example 2

A piezoelectric element of Comparative Example 2 was manufactured similar to Example 4 except that the composite of the piezoelectric layer 70 was set as $(K_{0.4}Na_{0.6})(Nb_{0.98}Mn_{0.02})O_3$.

Comparative Example 3

A piezoelectric element of Comparative Example 3 was manufactured similar to Example 1 except that the composite of the piezoelectric layer 70 was set as $(K_{0.4}Na_{0.6})(Nb_{0.997}Mn_{0.003})O_3$.

XPS Measurement

Regarding the examples and the comparative examples, X-ray photoemission spectroscopy (XPS) was measured by using "ESCALAB250" (manufactured by Thermo Fisher Scientific Co.). Regarding an X-ray source, evaluation was performed in a state where electro gun irradiation having a spot diameter of 500 $\mu m^2$ was performed for charging correction, by using Al-Kα rays.

Regarding a Survey spectrum, measuring was performed under conditions of a step interval of 1 eV, pass energy of 200 eV, an accumulating period of 100 μs. In order to reduce a change of a chemical state occurring by damage of the X-ray, five or more pieces for each of the samples were measured, results obtained by measuring was averaged, and the averaged results were used as measurement data. Correction of an energy axis in the device for XPS was performed by using Au, Ag, and Cu. An energy axis of each of the measured samples was corrected in such a manner that C1s, C—C, and C—H Peak were set to 284.8 eV. The waveform of Mn2p3 was separated by using a Voigt function. A position of peak energy referred to American Mineralogist, Volume 83, pages 305-315.

The molar ratio $(Mn^{2+}/Mn^{3+}+Mn^{4+})$ of the bivalent manganese obtained by the above measurement and the waveform separation will be shown below.

Example 1: 0.8
Example 2: 3.9
Example 3: 2.1
Example 4: 0.63
Example 5: 0.49
Example 6: 0.39
Example 7: 0.31
Comparative Example 1: 0
Comparative Example 2: 0.27
Comparative Example 3: 4.81

XRD Measurement

Regarding the examples and the comparative examples, X-ray diffraction (XRD) was measured by using "D8 Discover" (manufactured by Bruker AXS Co.). The measurement was performed by using CuKα as a ray source, and using a two-dimensional detector (GADDS) as a detector.

Figure 7A:
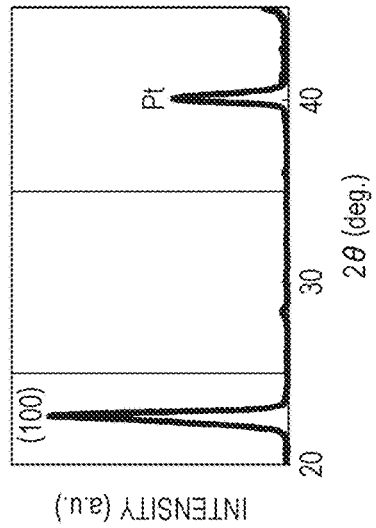
FIGS. 7A to 7G are diagrams illustrating XRD measurement results in examples and comparative examples.
Figure 7B:
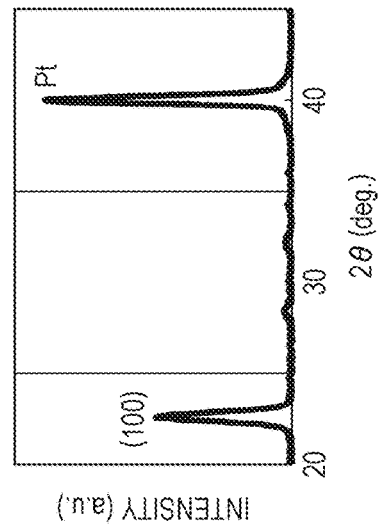
Figure 7C:
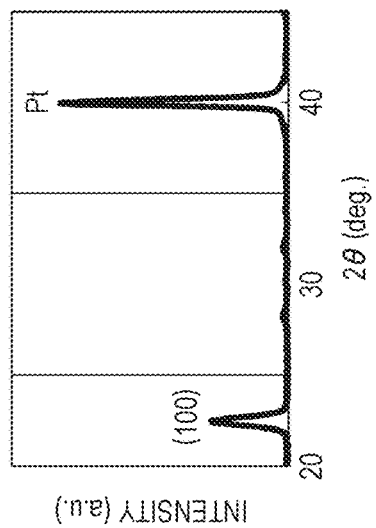
Figure 7D:
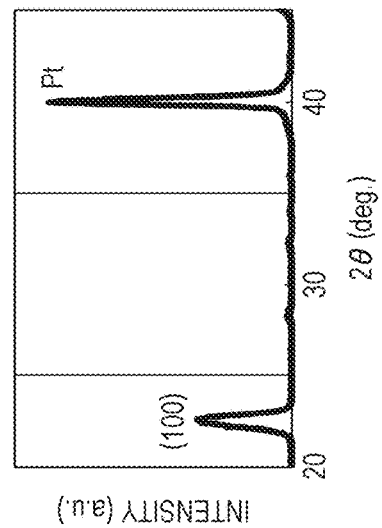
Figure 7E:
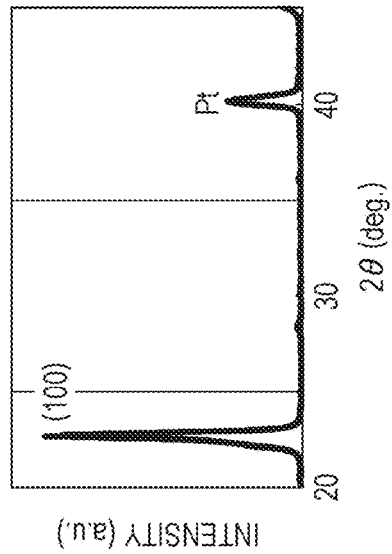
Figure 7F:
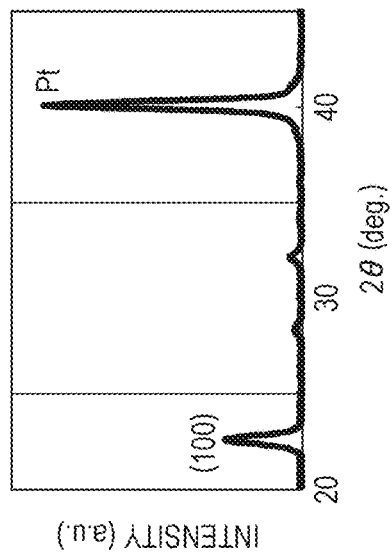
Figure 7G:
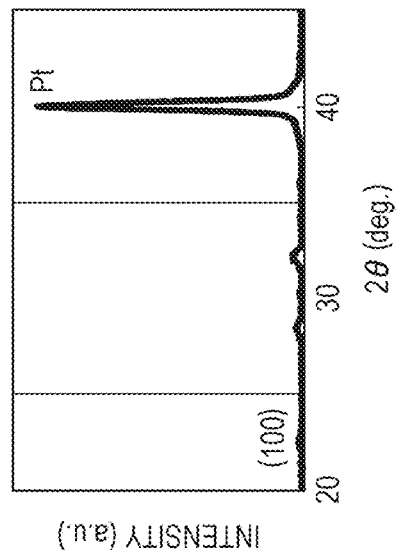
Figure 8:
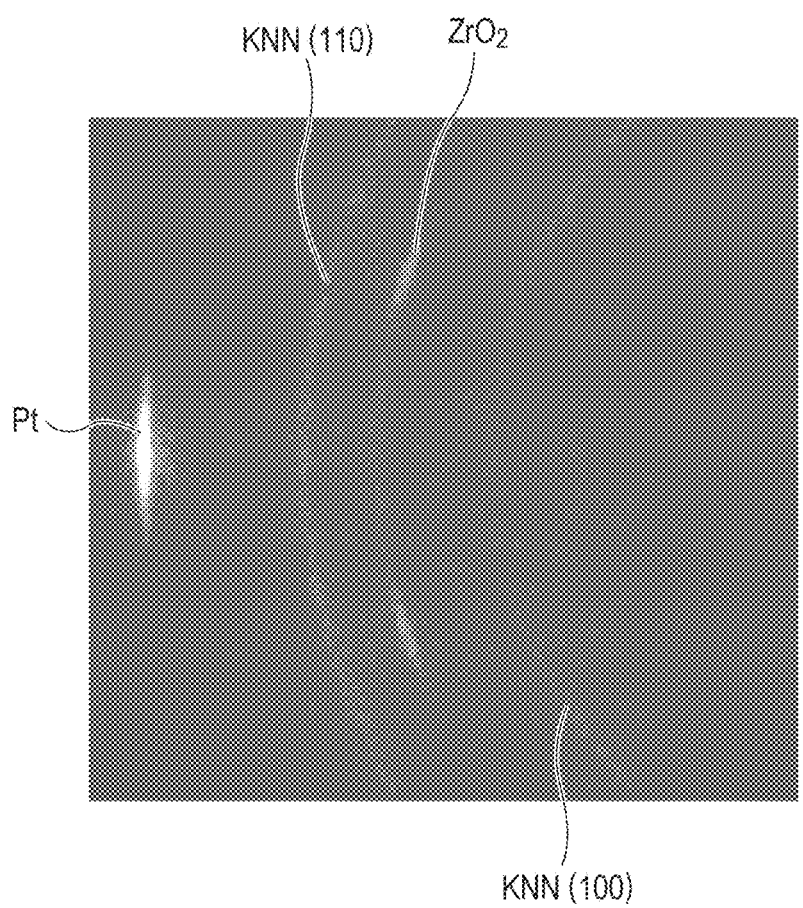
FIG. 8 illustrates an XRD two-dimensional image of Comparative Example 3.

XRD measurement results in Examples 1 to 4 and 7, and Comparative Examples 1 and 2 are shown in FIGS. 7A to 7G. An XRD two-dimensional image of Comparative Example 2 illustrated in FIG. 7G is shown in FIG. 8. As illustrated in FIG. 7F, in Comparative Example 1 in which manganese was not contained, it was understood that a perovskite-derived peak appeared strongly in the vicinity of 2θ=22.5°, and perovskite type compound oxide constituting the piezoelectric layer was oriented to (100) plane. Cases of Examples 1 to 4 and 7, and Comparative Example 2 in which manganese is contained were as follows. Firstly, as illustrated in FIG. 7A to 7E, in Examples 1 to 4 and 7 in which the ratio $(Mn^{2+}/Mn^{3+}+Mn^{4+})$ of the bivalent manganese was equal to or greater than 0.31, it was understood that a perovskite-derived peak appeared strongly in the vicinity of 2θ=22.5°, and perovskite type compound oxide constituting the piezoelectric layer was oriented to (100) plane. On the contrary, as illustrated in FIG. 7G, in Comparative Example 2 in which the ratio $(Mn^{2+}/Mn^{3+}+Mn^{4+})$ of the bivalent manganese was 0.27, it was understood that a peak in the vicinity of 2θ=22.5° was significantly weak. In addition, it was also understood that perovskite type compound oxide constituting the piezoelectric layer was randomly oriented, from the XRD two-dimensional image illustrated in FIG. 8. Thus, it was understood that (100) orientation was easily performed in a case where manganese was contained, and the ratio $(Mn^{2+}/Mn^{3+}+Mn^{4+})$ of the bivalent manganese was equal to or greater than 0.31. In FIGS. 7A to 7G, a strong peak appearing in the vicinity of 2θ=40° is derived from platinum (Pt) constituting the electrode.

P-E Hysteresis Measurement

Regarding the examples and the comparative examples, P-E hysteresis was measured with an applied voltage of 10 eV to 30 eV, at a frequency of 1 kHz by using "FCE measurement system" (manufactured by Toyo Co).

Figure 9B:
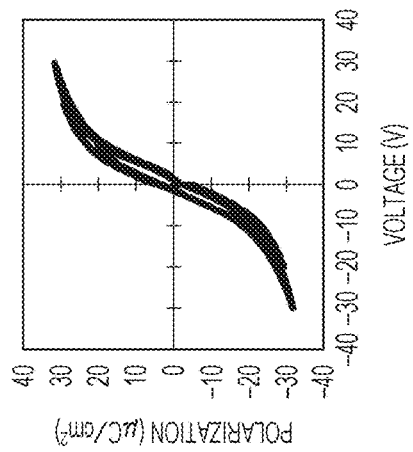
FIGS. 9A to 9H are diagrams illustrating P-E hysteresis measurement results in the examples and the comparative examples.
Figure 9D:
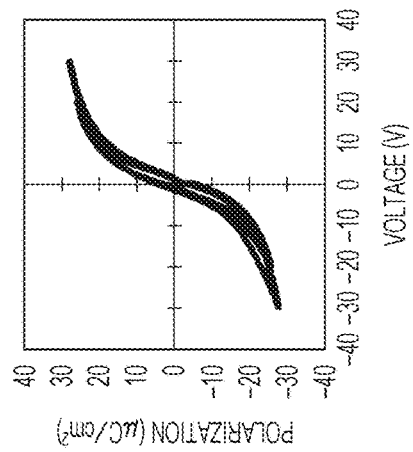
Figure 9A:
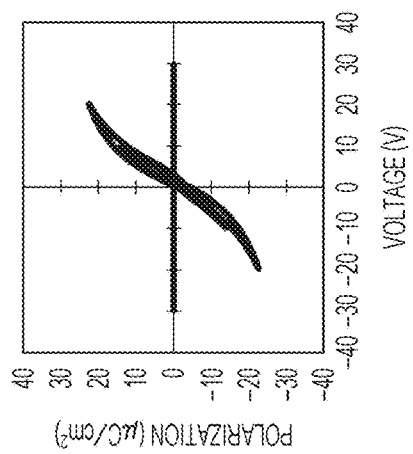
Figure 9C:
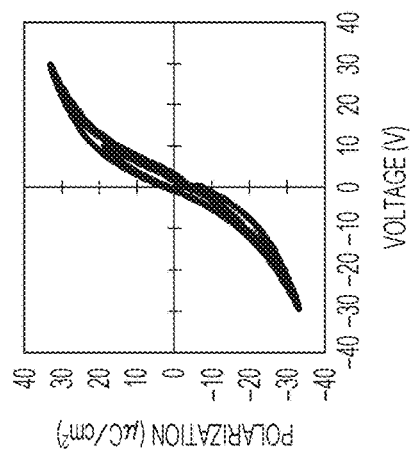
Figure 9F:
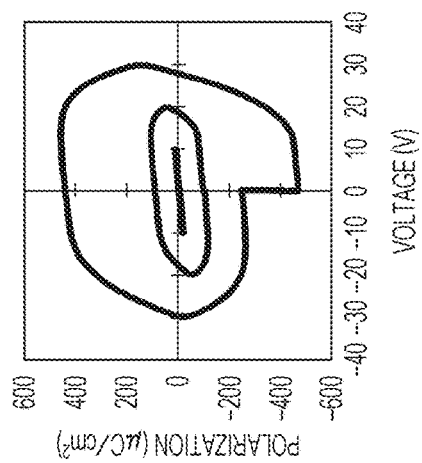
Figure 9H:
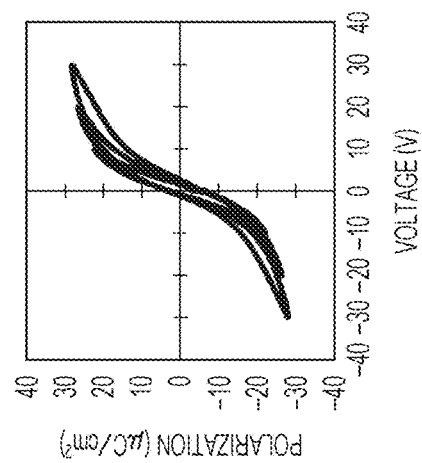
Figure 9E:
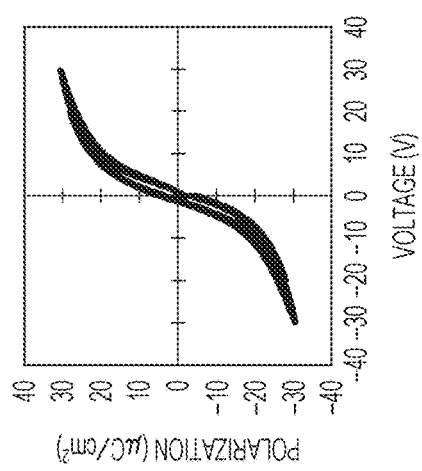
Figure 9G:
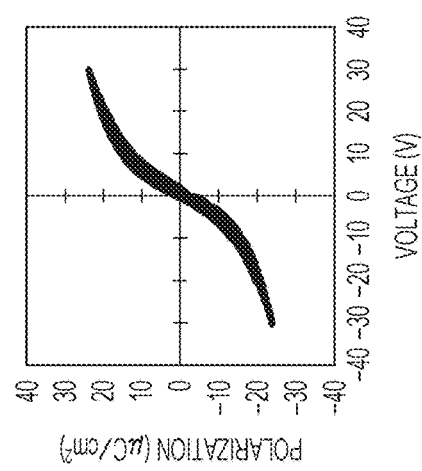

P-E hysteresis measurement results in Examples 1 to 4 and 7, and Comparative Examples 1 to 3 are shown in FIGS. 9A to 9H. As illustrated in FIGS. 9A to 9E and 9G, in Examples 1 to 4 and 7, and Comparative Example 2 in which manganese was contained and the ratio $(Mn^{2+}/Mn^{3+}+Mn^{4+})$ of the bivalent manganese was equal to or smaller than 3.9, P-E hysteresis in which a round was not provided was drawn. On the contrary, as illustrated in FIG. 9H, in Comparative Example 3 in which manganese was contained, and the ratio $(Mn^{2+}/Mn^{3+}+Mn^{4+})$ of the bivalent manganese was 4.81, P-E hysteresis in which a round was drawn due to leakage was provided. As illustrated in FIG. 9F, in Comparative Example 1 in which manganese was not added, leakage was large, and P-E hysteresis was not drawn.

Other Embodiments

Hitherto, the embodiment according to the invention is described. However, the basic configuration of the invention is not limited to the above-described form.

In the embodiment, a Si single crystal substrate is exemplified as the passage formation substrate. However, the passage formation substrate may be a SOI substrate or a material such as glass. Even when any substrate is used as the passage formation substrate, deterioration due to a reaction with alkali metal derived from the piezoelectric layer is predicted. Thus, providing the zirconium oxide layer which conducts the stopper function of K or Na is meaningful.

In the embodiment, as an example of the piezoelectric element applied device, the ink jet recording head is exemplified and described. However, the invention may be also applied to a liquid ejecting head which ejects a liquid other than an ink. Examples of such a liquid ejecting head include various recording heads used in an image recording apparatus such as a printer; a coloring material ejecting head used in manufacturing a color filter in a liquid crystal display and the like; an electrode material ejecting head used in forming an electrode in an organic EL display, a field emission display (FED), and the like; and a bio-organic material ejecting head used in manufacturing a bio-chip.

The invention is not limited to the piezoelectric element mounted in the liquid ejecting head. The invention may be also applied to a piezoelectric element mounted in other piezoelectric element applied devices. An example of the piezoelectric element applied device includes a MEMS element represented by a piezoelectric MEMS element.

As an example of the piezoelectric element applied device, an ultrasonic measurement device represented by an ultrasonic sensor and the like may be provided.

An example of the piezoelectric element applied device is not limited to the above-described examples. For example, a pyroelectric element in a piezoelectric actuator device, an ultrasonic motor, a pressure sensor, an IR sensor, and the like; and a ferroelectric element in a ferroelectric memory and the like are exemplified. These elements are just an example.

The thickness, the width, the relative positional relationship, and the like of the constituents illustrated in the drawings, that is, the layers and the like may be exaggeratedly illustrated in describing the invention. The term of "being on" in the specification is not limited to the meaning that the positional relationship between the constituents is "just on". For example, an expression that "the zirconium oxide layer on the substrate" or an expression that "the first electrode on the zirconium oxide layer" includes a case where other constituents are provided between the substrate and the zirconium oxide layer or between the zirconium oxide layer and the first electrode.

The entire disclosure of Japanese Patent Application No. 2015-109078, filed May 28, 2015 is expressly incorporated by reference herein.

What is claimed is:

1. A piezoelectric element comprising:
a first electrode which is formed on a substrate;
a piezoelectric layer which is formed on the first electrode, and is formed from a compound oxide having an $ABO_3$ type perovskite structure in which potassium (K), sodium (Na), niobium (Nb), and manganese (Mn) are provided; and
a second electrode which is formed on the piezoelectric layer,
wherein
the manganese includes bivalent manganese ($Mn^{2+}$), trivalent manganese ($Mn^{3+}$), and tetravalent manganese ($Mn^{4+}$), and
a molar ratio ($Mn^{2+}/Mn^{3+}+Mn^{4+}$) of the bivalent manganese to a sum of the trivalent manganese and the tetravalent manganese is equal to or greater than 0.31, wherein
a content of the manganese is greater than 0.3 mol %, with respect to a total amount of metallic elements constituting a B site of the $ABO_3$ type perovskite structure.

2. The piezoelectric element according to claim 1, wherein
the molar ratio ($Mn^{2+}/Mn^{3+}+Mn^{4+}$) of the bivalent manganese to the sum of the trivalent manganese and the tetravalent manganese is equal to or smaller than 3.90.

3. A piezoelectric element applied device comprising:
the piezoelectric element according to claim 2.

4. The piezoelectric element according to claim 1, wherein
the compound oxide in the $ABO_3$ type perovskite structure has a composite represented by the following formula (1):

$$(K_xNa_{1-x})(Nb_{1-y}Mn_y)O_3 \qquad (1),$$

wherein $0.1 \leq x \leq 0.9$.

5. A piezoelectric element applied device comprising:
the piezoelectric element according to claim 4.

6. A piezoelectric element applied device comprising:
the piezoelectric element according to claim 1.

7. A piezoelectric element comprising:
a first electrode which is formed on a substrate;
a piezoelectric layer which is formed on the first electrode, and is formed from a compound oxide having an $ABO_3$ type perovskite structure in which potassium (K), sodium (Na), niobium (Nb), and manganese (Mn) are provided; and
a second electrode which is formed on the piezoelectric layer,
wherein
the manganese includes bivalent manganese ($Mn^{2+}$), trivalent manganese ($Mn^{3+}$), and tetravalent manganese ($Mn^{4+}$), and
a molar ratio ($Mn^{2+}/Mn^{3+}+Mn^{4+}$) of the bivalent manganese to a sum of the trivalent manganese and the tetravalent manganese is equal to or greater than 0.31, wherein
a content of the manganese is equal to or smaller than 2 mol %, with respect to a total amount of metallic elements constituting a B site of the $ABO_3$ type perovskite structure.

8. A piezoelectric element applied device comprising:
the piezoelectric element according to claim 7.

9. The piezoelectric element according to claim 7, wherein
the molar ratio ($Mn^{2+}/Mn^{3+}+Mn^{4+}$) of the bivalent manganese to the sum of the trivalent manganese and the tetravalent manganese is equal to or smaller than 3.90.

10. A piezoelectric element applied device comprising:
the piezoelectric element according to claim 9.

11. The piezoelectric element according to claim 7, wherein
the compound oxide in the $ABO_3$ type perovskite structure has a composite represented by the following formula (1):

$$(K_xNa_{1-x})(Nb_{1-y}Mn_y)O_3 \qquad (1),$$

wherein $0.1 \leq x \leq 0.9$.

12. A piezoelectric element applied device comprising:
the piezoelectric element according to claim 11.

* * * * *